(12) United States Patent
Wu et al.

(10) Patent No.: US 9,051,655 B2
(45) Date of Patent: Jun. 9, 2015

(54) BORON IONIZATION FOR ALUMINUM OXIDE ETCH ENHANCEMENT

(71) Applicant: Applied Materials, Inc., Santa Clara, CA (US)

(72) Inventors: Kai Wu, Palo Alto, CA (US); Sang Ho Yu, Cupertino, CA (US); Kie Jin Park, San Jose, CA (US); Glen T. Mori, Gilroy, CA (US); Joshua Collins, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 3 days.

(21) Appl. No.: 14/028,099

(22) Filed: Sep. 16, 2013

(65) Prior Publication Data

US 2015/0076110 A1   Mar. 19, 2015

(51) Int. Cl.
*B44C 1/22* (2006.01)
*C23F 1/00* (2006.01)
*C23F 3/00* (2006.01)
*C23F 4/00* (2006.01)
*H01J 37/32* (2006.01)

(52) U.S. Cl.
CPC ............. *C23F 4/00* (2013.01); *H01J 37/32009* (2013.01); *H01J 2237/334* (2013.01)

(58) Field of Classification Search
CPC ................ C23F 4/00; H01L 21/32136; H01L 21/32139
USPC .......................................................... 216/77
See application file for complete search history.

(56) References Cited

U.S. PATENT DOCUMENTS

| 4,256,534 A | 3/1981 | Levinstein et al. |
| 4,350,563 A | 9/1982 | Takada et al. |
| 6,110,836 A | 8/2000 | Cohen et al. |

*Primary Examiner* — Roberts Culbert
(74) *Attorney, Agent, or Firm* — Patterson & Sheridan, LLP

(57) ABSTRACT

Embodiments described herein generally provide a method for performing a semiconductor precleaning process. More specifically, embodiments provided herein relate to boron ionization for aluminum oxide etch enhancement. A process for removing native oxide from aluminum may utilize ionized boron alone or in combination with a halogen plasma. The ionized boron may provide improved aluminum oxide etching properties while being highly selective for native oxides more generally.

11 Claims, 2 Drawing Sheets

BORON IONIZATION FOR ALUMINUM OXIDE ETCH ENHANCEMENT

BACKGROUND OF THE INVENTION

1. Field of the Invention

Embodiments of the present invention generally relate to substrate processing systems and chambers used to process semiconductor wafers, solar panels, and flat panel displays and, in particular, to depositing electrically conductive pasting material in a plasma processing chamber.

2. Description of the Related Art

To help ensure semiconductor device integrity and performance, a semiconductor substrate is often cleaned prior to depositing a film on the substrate to remove contaminants and native oxides which may reside on the substrate surface. Conventional preclean processes typically include a sputter etch process to remove the contaminants and expose the native oxides. The native oxides may then be removed by additional sputter etching and/or reactive etching which uses a reduction reaction.

During chip packaging, metal layers are used for connecting solder material to bond pads that are electrically connected to semiconductor devices. Generally, incoming wafers for under-bump metallization (UBM) processes consist of metal pads embedded in a polymer passivation layer, such as a polyimide layer. The metal pads, such as aluminum pads, must be cleaned prior to UBM to remove any native oxide, such as aluminum oxide, from the surface of the metal pads.

Conventional preclean chambers and processes often do not uniformly clean the surface of the every smaller features being fabricated on a substrate. Failure to properly clean these features may result in void formation or increased electrical resistance between the surface features. The native oxides and other contaminants which are present on the features may cause void formation by promoting the uneven distribution of material deposited on the substrate in a subsequent processing step, or by causing the corners of the features to grow, merge, and seal off before the feature is filled with material being deposited therein. Precleaning processes are especially desirable to uniformly etch and clean substrate surface for subsequent barrier layer or metal deposition processes.

Conventional processes for removing aluminum oxide may include various halogen sputtering processes. Although the sputtering processes alone may be effective at removing the native oxide, they may also undesirably remove portions of the underlying aluminum material and the passivation resulting in redeposition on various chamber components. Other processes may include utilizing various chemical compounds, such as boron trichloride to remove the native oxide from the aluminum pads. However, when boron trichloride is used, residual chloride molecules may remain on the aluminum pads which must then be removed in subsequent processes. For example, the aluminum pads may be fluorized to remove the chloride in combination with a subsequent hydrogen peroxide process to remove any residual fluoride molecules that may remain on the aluminum pads. The aforementioned process requires multiple processing steps which consume valuable time which may reduce the overall throughput for performing precleaning processes.

Therefore, there is a need in the art for a native oxide removal process which reduces sputtered material in the chamber and which improves the efficiency of precleaning processes.

SUMMARY OF THE INVENTION

Embodiments described herein generally provide a method for performing a semiconductor precleaning process. More specifically, embodiments provided herein relate to boron ionization for aluminum oxide etch enhancement.

In one embodiment, a precleaning method for removing native oxide from a metal feature formed on a substrate is provided. The method may comprise providing a substrate to a processing chamber. The substrate may have an aluminum feature formed thereon. An aluminum oxide film may be formed over the aluminum feature. The method may further comprise etching the aluminum oxide from the aluminum feature using a plasma comprising argon and a boron precursor.

In another embodiment, a precleaning method for removing native oxide from a metal feature formed on a substrate is provided. The method may comprise providing a substrate to a processing chamber. The substrate may have an aluminum feature formed thereon. An aluminum oxide film may be formed over the aluminum feature. The method may further comprise etching the aluminum oxide from the aluminum feature using forming a plasma comprising argon and a $B_2H_6$ precursor in a ratio of about 1:9 argon to $B_2H_6$.

In yet another embodiment, a precleaning method for removing native oxide from a metal feature formed on a substrate is provided. The method may comprise providing a substrate to a processing chamber. The substrate may have an aluminum feature formed thereon. An aluminum oxide film may be formed over the aluminum feature. The method may further comprise etching the aluminum oxide from the aluminum feature using a plasma comprising a boron precursor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that features of one embodiment may be incorporated in other embodiments without further recitation.

DETAILED DESCRIPTION

Embodiments described herein generally provide a method for performing a semiconductor precleaning process. More specifically, embodiments provided herein relate to boron ionization for aluminum oxide etch enhancement. A process for removing native oxide from aluminum may utilize ionized boron alone or in combination with a halogen plasma. The ionized boron may provide improved aluminum oxide etching properties while being highly selective for native oxides more generally.

Figure 1:
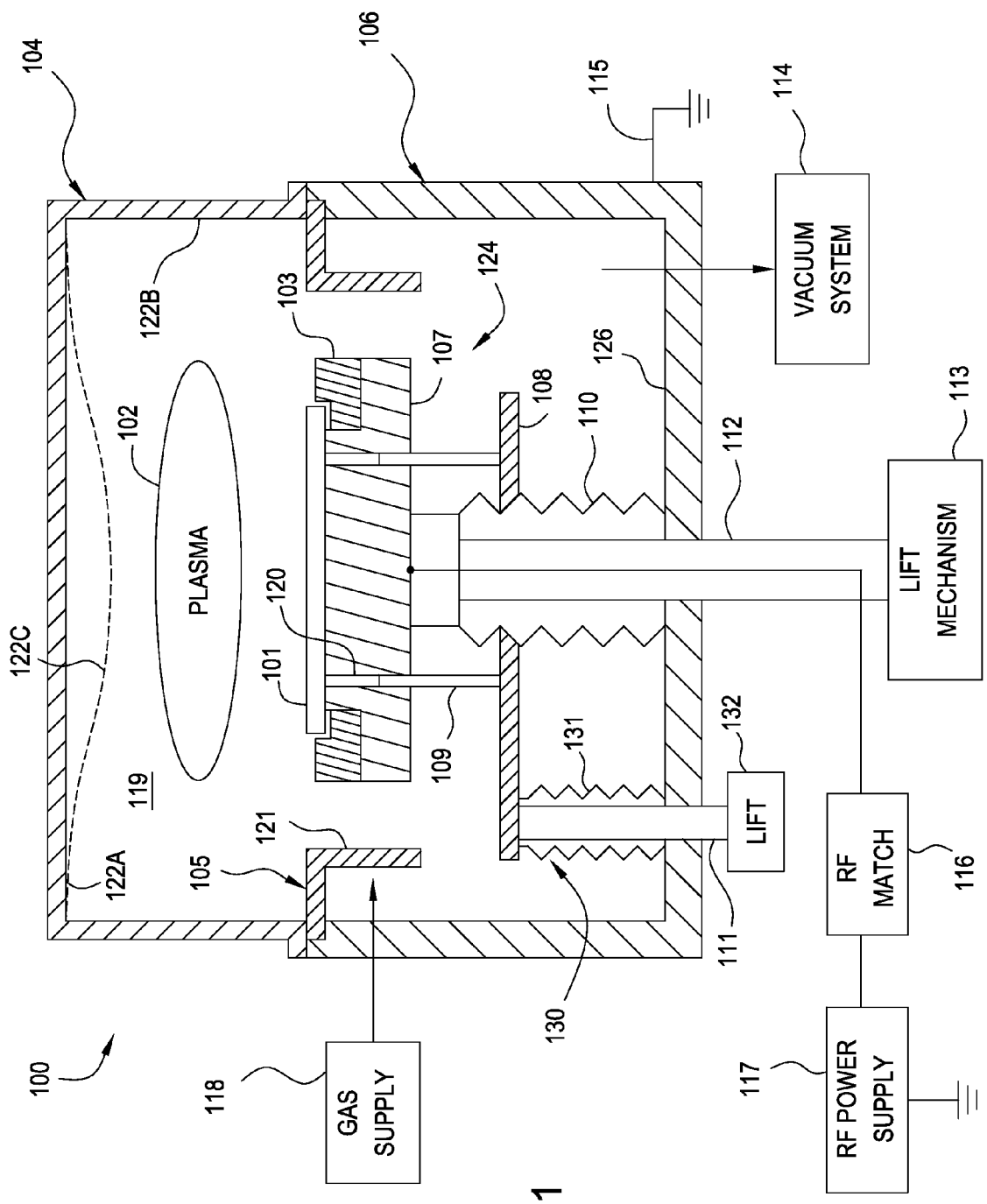
FIG. 1 is a cross-sectional schematic view of a sputter etch process chamber.

FIG. 1 is a cross-sectional schematic view of a sputter etch process chamber according to one embodiment described herein. In another embodiment, other types of plasma processing chambers may be used to practice the embodiments described herein. A chamber 100 may include a chamber body 106 covered by a dome 104 having a top interior surface 122A and sidewall interior surfaces 122B which may enclose a processing volume 119. The dome 104 may be designed to have a top interior surface 122C so that a central portion of the dome 104 may be closer to a substrate 101 so that the etch rate near the center of the substrate 101 may be reduced. The chamber 100 may also include one or more deposition shields 105 with walls 121 circumscribing various chamber components to prevent unwanted reaction between such components and ionized process material. Dome shields (not shown) may also be located near dome 104 to prevent deposition of sputtered material onto top interior surface 122A and sidewall interior surfaces 122B. The chamber body 106 and dome 104 may be made of metal, such as aluminum. The chamber 100 may be a vacuum chamber and may be suitably adapted to maintain sub-atmospheric pressures during substrate processing.

A substrate support 124 may be disposed within the processing volume 119 for supporting the substrate 101, which may be a semiconductor substrate. The substrate support 124 may further comprise a pedestal 107 upon which the substrate 101 rests and a support shaft 112 which may be coupled to a first lift mechanism 113 which may provide vertical movement of the substrate support 124 between an upper processing position (as shown in FIG. 1) and a lower transfer position (not shown). A first bellows assembly 110 may be coupled between the substrate support 124 and chamber bottom 126 to provide a flexible seal that allows vertical motion of the substrate support 124 while preventing loss of vacuum from within the etch chamber 100. A substrate lift 130 may include lift pins 109 mounted on a platform 108 connected to a shaft 111 which may be coupled to a second lift mechanism 132 for raising and lowering the substrate lift 130 so that the substrate 101 may be placed on or removed from the pedestal 107. The pedestal may include thru-holes 120 to receive the lift pins 109. A second bellows assembly 131 may be coupled between the substrate lift 130 and chamber bottom 126 to provide a flexible seal which maintains chamber vacuum during vertical motion of the substrate lift 130.

The chamber 100 may be coupled to and in fluid communication with a vacuum system 114 which may include a throttle valve (not shown) and vacuum pump (not shown) which may be used to exhaust the chamber 100. The pressure inside the chamber 100 may be regulated by adjusting the throttle valve and/or vacuum pump. The chamber 100 may also coupled to and in fluid communication with a gas supply 118 which may supply one or more process gasses to the etch chamber 100 for etch processing. Examples of suitable gases may include halogen gases, such as argon, or other processing precursors. Suitable examples of processing precursors may include $BCl_3$, $BF_3$, $B_2H_6$, $Cl$, $F$, $H_2O_2$, and $H_2$ and the like.

To create the desired plasma for sputter etching the substrate 101, the pedestal 107 may be coupled to a radio frequency (RF) match 116 and RF power supply 117. The pedestal 107 may include electrodes (not shown) disposed near the substrate support surface and these electrodes may be coupled to one or more RF matches 116 and one or more RF power supplies 117. The pedestal 107 functions as an RF cathode which is electrically isolated from the chamber body 106 and dome 104 which may be connected to a ground 115. Process gas, such as argon, may be introduced into the etch chamber 100 from gas supply 118 and the gas pressure may be adjusted to a preset value for plasma ignition. Other processing gases, such as $BF_3$ and $B_2H_6$, may be provided instead of or co-flowed with the argon process gas. In general, a boron ion may reduce an oxide material by scavenging oxygen which may facilitate the oxide's removal from the substrate.

A plasma 102 may be ignited in the processing volume 119 through capacitive coupling when RF power is delivered to the pedestal 107. Other plasma generation techniques, such as inductive coupling or utilizing a remote plasma system, may also be used instead of or in combination with the capacitive coupling. The RF match 116 may be adjusted or preset to improve the efficiency of power transfer from the RF power supply 117 to the plasma 102. In addition to providing a plasma source, the RF power supply 117 may also apply a bias to the pedestal 107 so that positively charged ions in the plasma 102 may be accelerated to the surface of the substrate 101 and the substrate surface may be sputter etched.

The RF power supply 117 may provide power at a frequency of 13.56 MHz, but other frequencies may also be used. In one embodiment, two RF frequencies may be used to drive the pedestal 107. A lower frequency may be used to drive the bias and thereby the ion energy. A higher frequency may be used to drive plasma creation and plasma energy.

The etch uniformity at the substrate 101 surface may depend in part on the chamber 100 pressure during processing which is preferably maintained between about 0.5 mTorr and about 100 mTorr. The pressure may be controlled by adjusting the vacuum system 114. As previously noted, etch uniformity may also be determined in part by the electric field distribution near the substrate surface. If the electric field in nonuniform along the substrate surface, the etch rate will also tend to be nonuniform along the substrate surface. Nonuniformity of the electric field may be especially pronounced near the edges of the substrate since electric charges tend to concentrate along sharp edges or radii and this may cause higher etch rates near the edges of the substrate. To help mitigate this "edge effect", an edge ring 103 made of dielectric material is disposed on the pedestal 107 so that the edge ring 103 surrounds the edges of the substrate 101. The edge ring 103 may block some of the ion flux during sputter etching and also help produce a more uniform electric field near the edge of the substrate 101. The edge ring 103 may be made of quartz, aluminum oxide, or other dielectric materials.

A controller, including a central processing unit (CPU), a memory, and support circuits for the CPU, may be coupled to the various components of the substrate processing chamber to facilitate control of the chamber cleaning process. To facilitate control of the chamber as described above, the CPU may be one of any form of general purpose computer processor that can be used in an industrial setting for controlling various chambers and subprocessors. The memory, or computer readable medium, is coupled to the CPU and may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits generally include a cache, power supplies, clock circuits, input/output circuitry, subsystems, and the like. A process for removing native oxide from a substrate, such as the methods described herein, is generally stored in the memory as a software routine. The software routine may also be stored and/or executed by a second CPU that is remotely located from the hardware being controlled by the CPU.

Generally, a packaging preclean process may be performed in a semiconductor processing chamber, such as the chamber 100. It is contemplated that the methods described herein for removing native oxide, especially aluminum oxide, may be performed in various chambers which are available from Applied Materials, Inc. Santa Clara, Calif. A preferred chamber is the Charger™ preclean chamber. It is noted that chambers available from other manufacturers may also be utilized to practice the present invention.

Figure 2:
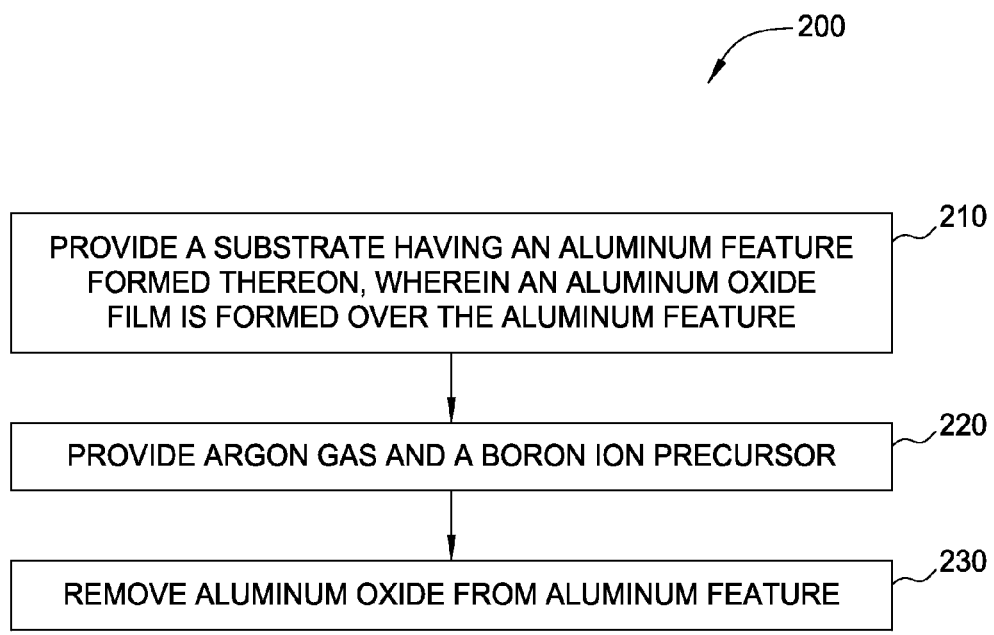
FIG. 2 depicts a method of removing native oxide from a substrate.

FIG. 2 depicts a method 200 of removing native oxide from a substrate. The method described herein, according to various embodiments, may be especially advantageous for removing aluminum oxide from an aluminum contact pad in a UBM packaging scheme. At operation 210, a substrate having an aluminum feature, such as an aluminum contact pad, formed thereon may be provided to a processing chamber. In one example, the aluminum feature may have a thickness of between about 3000 Å and about 7000 Å, such as about 5000 Å. As a result of previous exposure to an oxidizing environment, the aluminum feature may have a native oxide layer (aluminum oxide) formed thereon. In one example, the aluminum oxide may have a thickness of between about 200 Å and about 600 Å, such as about 400 Å. Although described with regard to aluminum and its native oxide, it is contemplated that various other metals and removal of their respective native oxides may benefit from the embodiments described herein.

At operation 220, a sputtering gas comprising argon and a boron ion precursor may be provided to the chamber. In certain embodiments, the boron ion precursor may be provided without the sputtering gas. In embodiments described with regard to Table 1 (provided below), the sputtering gas and the boron ion precursor, such as $BF_3$, may be energized by capacitively coupling RF energy at a frequency of about 13.56 MHz at a power level of between about 400 W and about 600 W, such as about 500 W; and RF energy at a frequency of about 60 MHz at a power level of between about 1000 W and about 1400 W, such as about 1200 W. The sputtering process may proceed at a temperature of between about 10° C. and about 50° C., such as about 25° C.; a pressure of between about 1 mT and about 30 mT, such as about 15 mT; and for a time of between about 30 sec and about 90 sec, such as about 60 sec. At operation 230, the native aluminum oxide may be removed (etched or sputtered) from the aluminum feature.

Various bias voltages, flow rates and X-ray fluorescence counts of aluminum oxide and aluminum at the various bias voltages and flow rates are provided in Table 1 below.

TABLE 1

| Bias V | $BF_3$ sccm | Ar sccm | $Al_2O_3$ etch XRF count | Al etch XRF count |
|---|---|---|---|---|
| 1600-2200 | 0 | 100 | 0.89 | 4.22 |
| 3300-3500 | 100 | 0 | 1.67 | 0.92 |
| 3150-3500 | 100 | 10 | 2.23 | 4.48 |
| 2125-2300 | 10 | 100 | 2.47 | 4.30 |

The XRF count may represent a value which has a substantially linear gain representative of a measurement of a thickness of material being etched. For example, a higher XRF count may denote a faster etch of the subject material. As depicted in Table 1, argon may be utilized without $BF_3$. In this embodiment, aluminum oxide may be sputtered at a reasonably low rate and aluminum is sputtered at a much higher rate. This may be undesirable because it may not be desirable to etch away the underlying aluminum layer. Although it may generally be undesirable to etch the underlying aluminum layer, it is accepted that some aluminum may be etched in return for a greater removal rate of the native aluminum oxide.

In embodiments where $BF_3$ is provided without argon, the aluminum oxide may be etched at a greater rate than utilizing argon alone. In addition, a lesser amount of aluminum may be etched when no argon it utilized. Thus, it is contemplated that the $BF_3$ may be a desirable etch species as an etch stop to prevent etching of the underlying aluminum layer. In the embodiment where $BF_3$ (100 sccm) and argon (10 sccm) are provided together in a ratio of about 10:1 ($BF_3$:Ar), the aluminum oxide may be etched at a greater rate than either $BF_3$ alone or argon alone. However, the aluminum may also be etched at a greater rate than either $BF_3$ alone or argon alone. In the embodiment where $BF_3$ (10 sccm) and argon (100 sccm) are provided together in a ratio of about 1:10 ($BF_3$:Ar), the aluminum oxide may be etched at a greater rate than either $BF_3$ alone, argon alone, or $BF_3$ with argon, wherein the $BF_3$ is provided in a greater amount. The aluminum may be etched at a greater rate than either $BF_3$ alone or argon alone, however, the aluminum may be etched at a rate less than the rate of etch when $BF_3$ is provided with argon, wherein the $BF_3$ is provided in a greater amount.

Referring back to another embodiment of operation 220, embodiments described with regard to Table 2 (provided below) are now discussed. The sputtering gas and the boron ion precursor, such as $B_2H_6$, may be energized by capacitively coupling RF energy at a frequency of about 13.56 MHz at a power level of between about 300 W and about 500 W, such as about 400 W. The sputtering process may proceed at a temperature of between about 25° C. and about 200° C., such as about 100° C.; a pressure of between about 100 mT and about 10 T, such as about 1 T; and for a time of between about 90 sec and about 180 sec, such as about 120 sec.

TABLE 2

| Bias V | $B_2H_6$ sccm | Ar sccm | $Al_2O_3$ etch XRF count |
|---|---|---|---|
| 0 | 0 | 1000 | 0.048 |
| 0 | 100 | 900 | 0.144 |

As depicted in Table 2, argon may be utilized without $B_2H_6$. In this embodiment, aluminum oxide may be sputtered at a reasonably low rate. In embodiments where $B_2H_6$ is provided with argon in a ratio of about 1:9 ($B_2H_6$:Ar), the aluminum oxide may be etched at a greater rate than utilizing argon alone. Thus, it is contemplated that $B_2H_6$ may be a desirable etch species as an etch stop to prevent etching of the underlying aluminum layer while increasing the rate of aluminum oxide etching.

In general, the ionized boron may not etch the aluminum at all or may only do so a negligible amount. However, the ionized boron greatly increases the etch rate of the aluminum oxide in the embodiments described with regard to Table 1 and Table 2. As may be derived from Table 1 and Table 2 by comparing the XRF counts, the ionized boron may increase the etch rate of aluminum oxide by about 2.5 to 3.0 times when compared to an argon only etch. Thus, the ionized boron may act as a selective etch species for aluminum/aluminum oxide to control an endpoint and minimize aluminum loss.

While the above embodiments are described as being performed in a single chamber, it may be possible to perform the processes in more than one chamber. For example, the substrate having an aluminum feature with a native oxide formed thereon may be subjected to a $BF_3$ or $B_2H_6$ soaking process in a first chamber and subsequently argon sputtered in a second chamber. The boron ion soaking process may utilize a plasma of boron ions provided to the native oxide. The boron ions may absorb into the native oxide and remain in the native oxide layer until the native oxide is sputtered by the subsequent argon plasma.

While the foregoing is directed to embodiments of the present invention, other and further embodiments of the invention may be devised without departing from the basic scope thereof, and the scope thereof is determined by the claims that follow.

The invention claimed is:

1. A precleaning method for removing native oxide from a metal feature formed on a substrate, comprising:
    providing a substrate to a processing chamber, the substrate having an aluminum feature formed thereon, wherein an aluminum oxide film is formed over the aluminum feature; and
    etching the aluminum oxide from the aluminum feature using a plasma comprising argon and a boron precursor comprising $B_2H_6$.

2. The method of claim 1, wherein the plasma further comprises boron ions.

3. The method of claim 1, wherein the $B_2H_6$ and argon are provided in a ratio of about 1:9 and about 9:1.

4. The method of claim 1, wherein the forming a plasma and the etching the aluminum oxide are performed in a single chamber.

5. The method of claim 1, wherein the forming a plasma comprising the boron precursor is performed in a first chamber and the forming the argon plasma and etching the aluminum oxide are performed in a second chamber.

6. A precleaning method for removing native oxide from a metal feature formed on a substrate, comprising:
    providing a substrate to a processing chamber, the substrate having an aluminum feature formed thereon, wherein an aluminum oxide film is formed over the aluminum feature; and
    etching the aluminum oxide from the aluminum feature using a plasma comprising argon and a $B_2H_6$ precursor in a ratio of about 1:9 argon to $B_2H_6$.

7. The method of claim 6, wherein the forming a plasma and the etching the aluminum oxide are performed in a single chamber.

8. The method of claim 7, wherein the etching is performed for between about 90 sec and about 180 sec.

9. The method of claim 8, wherein the etching is performed at a temperature of between about 25° C. and about 200° C.

10. The method of claim 6, wherein the forming a plasma comprising the $B_2H_6$ precursor is performed in a first chamber and the forming the argon plasma and etching the aluminum oxide are performed in a second chamber.

11. A precleaning method for removing native oxide from a metal feature formed on a substrate, comprising:
    providing a substrate to a processing chamber, the substrate having an aluminum feature formed thereon, wherein an aluminum oxide film is formed over the aluminum feature; and
    etching the aluminum oxide from the aluminum feature using a plasma comprising a boron precursor comprising $B_2H_6$.

* * * * *